(12) United States Patent
Hsia

(10) Patent No.: US 10,492,265 B1
(45) Date of Patent: Nov. 26, 2019

(54) SOLID-STATE LIGHTING WITH A CONTROL GEAR CASCADED BY A LUMINAIRE

(71) Applicant: Aleddra Inc., Renton, WA (US)

(72) Inventor: Chungho Hsia, Bellevue, WA (US)

(73) Assignee: ALEDDRA INC., Renton, WA (US)

( * ) Notice: Subject to any disclaimer, the term of this patent is extended or adjusted under 35 U.S.C. 154(b) by 0 days.

(21) Appl. No.: 16/530,747

(22) Filed: Aug. 2, 2019

Related U.S. Application Data

(63) Continuation-in-part of application No. 16/458,823, filed on Jul. 1, 2019, which is a continuation-in-part of application No. 16/432,735, filed on Jun. 5, 2019, now Pat. No. 10,390,396, which is a continuation-in-part of application No. 16/401,849, filed on May 2, 2019, now Pat. No. 10,390,395, which is a continuation-in-part of application No. 16/296,864, filed on Mar. 8, 2019, now Pat. No. 10,390,394, which is a continuation-in-part of application No. 16/269,510, filed on Feb. 6, 2019, now Pat. No. 10,314,123, which is a continuation-in-part of application No. 16/247,456, filed on Jan. 14, 2019, now Pat. No. 10,327,298, which is a continuation-in-part of application No. 16/208,510, filed on Dec. 3, 2018, now Pat. No.
(Continued)

(51) Int. Cl.
| | |
|---|---|
| H05B 33/08 | (2006.01) |
| H02J 9/06 | (2006.01) |
| H02J 7/00 | (2006.01) |
| G01R 31/385 | (2019.01) |

(52) U.S. Cl.
CPC ....... *H05B 33/0887* (2013.01); *G01R 31/385* (2019.01); *H02J 7/0068* (2013.01); *H02J 9/065* (2013.01); *H05B 33/0809* (2013.01)

(58) Field of Classification Search
None
See application file for complete search history.

(56) References Cited

U.S. PATENT DOCUMENTS

| | | | | |
|---|---|---|---|---|
| 5,867,377 A | * | 2/1999 | Suranyi | H02J 9/061 307/64 |
| 9,887,580 B2 | * | 2/2018 | Jagjitpati | H05B 33/0815 |

(Continued)

*Primary Examiner* — Minh D A
*Assistant Examiner* — James H Cho
(74) *Attorney, Agent, or Firm* — Han IP PLLC; Andy M. Han

(57) ABSTRACT

A light-emitting diode (LED) lighting system comprising a luminaire and an LED luminaire control gear is used to replace the luminaire operated with alternate-current (AC) mains. The luminaire coupled to the LED luminaire control gear comprises LED arrays and a power supply. The LED luminaire control gear comprises a rechargeable battery, a current-fed inverter, and a relay switch. When a line voltage from the AC mains is unavailable, the LED luminaire control gear is automatically started to provide a high output voltage within an input operating voltage range of the luminaire and a low direct-current (DC) voltage to control the power supply to provide an LED driving voltage greater than a forward voltage across the LED arrays, eliminating operating instability of the power supply. The relay switch is configured to couple either the line voltage or the high output voltage to the power supply to operate thereon.

31 Claims, 4 Drawing Sheets

Related U.S. Application Data 10,237,946, which is a continuation-in-part of application No. 16/154,707, filed on Oct. 8, 2018, now Pat. No. 10,225,905, which is a continuation-in-part of application No. 15/947,631, filed on Apr. 6, 2018, now Pat. No. 10,123,388, which is a continuation-in-part of application No. 15/911,086, filed on Mar. 3, 2018, now Pat. No. 10,136,483, which is a continuation-in-part of application No. 15/897,106, filed on Feb. 14, 2018, now Pat. No. 10,161,616, which is a continuation-in-part of application No. 15/874,752, filed on Jan. 18, 2018, now Pat. No. 10,036,515, which is a continuation-in-part of application No. 15/836,170, filed on Dec. 8, 2017, now Pat. No. 10,021,753, which is a continuation-in-part of application No. 15/649,392, filed on Jul. 13, 2017, now Pat. No. 9,986,619, which is a continuation-in-part of application No. 15/444,536, filed on Feb. 28, 2017, now Pat. No. 9,826,595, which is a continuation-in-part of application No. 15/362,772, filed on Nov. 28, 2016, now Pat. No. 9,967,927, which is a continuation-in-part of application No. 15/225,748, filed on Aug. 1, 2016, now Pat. No. 9,743,484, which is a continuation-in-part of application No. 14/818,041, filed on Aug. 4, 2015, now Pat. No. 9,420,663, which is a continuation-in-part of application No. 14/688,841, filed on Apr. 16, 2015, now Pat. No. 9,288,867, which is a continuation-in-part of application No. 14/465,174, filed on Aug. 21, 2014, now Pat. No. 9,277,603, which is a continuation-in-part of application No. 14/135,116, filed on Dec. 19, 2013, now Pat. No. 9,163,818, which is a continuation-in-part of application No. 13/525,249, filed on Jun. 15, 2012, now Pat. No. 8,749,167.

(56) References Cited

U.S. PATENT DOCUMENTS

| | | | |
|---|---|---|---|
| 10,193,368 B2 * | 1/2019 | Zhang | H02J 7/045 |
| 2019/0058343 A1 * | 2/2019 | Liu | H02M 3/33523 |

* cited by examiner

SOLID-STATE LIGHTING WITH A CONTROL GEAR CASCADED BY A LUMINAIRE

CROSS-REFERENCE TO RELATED APPLICATIONS

The present disclosure is part of a continuation-in-part (CIP) application of U.S. patent application Ser. No. 16/458,823, filed 1 Jul. 2019, which is part of CIP application of U.S. patent application Ser. No. 16/432,735, filed 5 Jun. 2019 and issued as U.S. Pat. No. 10,390,396 on 20 Aug. 2019, which is part of CIP application of U.S. patent application Ser. No. 16/401,849, filed 2 May 2019 and issued as U.S. Pat. No. 10,390,395 on 20 Aug. 2019, which is part of CIP application of U.S. patent application Ser. No. 16/296,864, filed 8 Mar. 2019 and issued as U.S. Pat. No. 10,390,394 on 20 Aug. 2019, which is part of CIP application of U.S. patent application Ser. No. 16/269,510, filed 6 Feb. 2019 and issued as U.S. Pat. No. 10,314,123 on 4 Jun. 2019, which is part of CIP application of U.S. patent application Ser. No. 16/247,456, filed 14 Jan. 2019 and issued as U.S. Pat. No. 10,327,298 on 18 Jun. 2019, which is part of CIP application of U.S. patent application Ser. No. 16/208,510, filed 3 Dec. 2018 and issued as U.S. Pat. No. 10,237,946 on 19 Mar. 2019, which is part of CIP application of U.S. patent application Ser. No. 16/154,707, filed 8 Oct. 2018 and issued as U.S. Pat. No. 10,225,905 on 5 Mar. 2019, which is part of a CIP application of U.S. patent application Ser. No. 15/947,631, filed 6 Apr. 2018 and issued as U.S. Pat. No. 10,123,388 on 6 Nov. 2018, which is part of a CIP application of U.S. patent application Ser. No. 15/911,086, filed 3 Mar. 2018 and issued as U.S. Pat. No. 10,136,483 on 20 Nov. 2018, which is part of a CIP application of U.S. patent application Ser. No. 15/897,106, filed 14 Feb. 2018 and issued as U.S. Pat. No. 10,161,616 on 25 Dec. 2018, which is a CIP application of U.S. patent application Ser. No. 15/874,752, filed 18 Jan. 2018 and issued as U.S. Pat. No. 10,036,515 on 31 Jul. 2018, which is a CIP application of U.S. patent application Ser. No. 15/836,170, filed 8 Dec. 2017 and issued as U.S. Pat. No. 10,021,753 on 10 Jul. 2018, which is a CIP application of U.S. patent application of Ser. No. 15/649,392 filed 13 Jul. 2017 and issued as U.S. Pat. No. 9,986,619 on 29 May 2018, which is a CIP application of U.S. patent application Ser. No. 15/444,536, filed 28 Feb. 2017 and issued as U.S. Pat. No. 9,826,595 on 21 Nov. 2017, which is a CIP application of U.S. patent application Ser. No. 15/362,772, filed 28 Nov. 2016 and issued as U.S. Pat. No. 9,967,927 on 8 May 2018, which is a CIP application of U.S. patent application Ser. No. 15/225,748, filed 1 Aug. 2016 and issued as U.S. Pat. No. 9,743,484 on 22 Aug. 2017, which is a CIP application of U.S. patent application Ser. No. 14/818,041, filed 4 Aug. 2015 and issued as U.S. Pat. No. 9,420,663 on 16 Aug. 2016, which is a CIP application of U.S. patent application Ser. No. 14/688,841, filed 16 Apr. 2015 and issued as U.S. Pat. No. 9,288,867 on 15 Mar. 2016, which is a CIP application of U.S. patent application Ser. No. 14/465,174, filed 21 Aug. 2014 and issued as U.S. Pat. No. 9,277,603 on 1 Mar. 2016, which is a CIP application of U.S. patent application Ser. No. 14/135,116, filed 19 Dec. 2013 and issued as U.S. Pat. No. 9,163,818 on 20 Oct. 2015, which is a CIP application of U.S. patent application Ser. No. 13/525,249, filed 15 Jun. 2012 and issued as U.S. Pat. No. 8,749,167 on 10 Jun. 2014. Contents of the above-identified applications are incorporated herein by reference in their entirety.

BACKGROUND

Technical Field

The present disclosure relates to light-emitting diode (LED) lighting systems and more particularly to an LED lighting system that includes an LED luminaire control gear cascaded by a luminaire to operate the luminaire no matter whether a line voltage from alternate-current (AC) mains is available or not.

Description of the Related Art

Solid-state lighting from semiconductor LEDs has received much attention in general lighting applications today. Because of its potential for more energy savings, better environmental protection (with no hazardous materials used), higher efficiency, smaller size, and longer lifetime than conventional incandescent bulbs and fluorescent tubes, the LED-based solid-state lighting will be a mainstream for general lighting in the near future. Meanwhile, as LED technologies develop with the drive for energy efficiency and clean technologies worldwide, more families and organizations will adopt LED lighting for their illumination applications. In this trend, the potential safety concerns such as risk of electric shock and fire become especially important and need to be well addressed.

In today's retrofit applications of an LED lamp to replace an existing fluorescent lamp, consumers may choose either to adopt a ballast-compatible LED lamp with an existing ballast used to operate the fluorescent lamp or to employ an AC mains-operable LED lamp by removing/bypassing the ballast. Either application has its advantages and disadvantages. In the former case, although the ballast consumes extra power, it is straightforward to replace the fluorescent lamp without rewiring, which consumers have a first impression that it is the best alternative. But the fact is that total cost of ownership for this approach is high regardless of very low initial cost. For example, the ballast-compatible LED lamps work only with particular types of ballasts. If the existing ballast is not compatible with the ballast-compatible LED lamp, the consumer will have to replace the ballast. Some facilities built long time ago incorporate different types of fixtures, which requires extensive labor for both identifying ballasts and replacing incompatible ones. Moreover, the ballast-compatible LED lamp can operate longer than the ballast. When an old ballast fails, a new ballast will be needed to replace in order to keep the ballast-compatible LED lamps working. Maintenance will be complicated, sometimes for the lamps and sometimes for the ballasts. The incurred cost will preponderate over the initial cost savings by changeover to the ballast-compatible LED lamps for hundreds of fixtures throughout a facility. In addition, replacing a failed ballast requires a certified electrician. The labor costs and long-term maintenance costs will be unacceptable to end users. From energy saving point of view, a ballast constantly draws power, even when the ballast-compatible LED lamps are dead or not installed. In this sense, any energy saved while using the ballast-compatible LED lamps becomes meaningless with the constant energy use by the ballast. In the long run, the ballast-compatible LED lamps are more expensive and less efficient than self-sustaining AC mains-operable LED lamps.

On the contrary, an AC mains-operable LED lamp does not require a ballast to operate. Before use of the AC mains-operable LED lamp, the ballast in a fixture must be removed or bypassed. Removing or bypassing the ballast does not require an electrician and can be replaced by end users. Each AC mains-operable LED lamp is self-sustaining. Once installed, the AC mains-operable LED lamps will only need to be replaced after 50,000 hours. In view of above advantages and disadvantages of both the ballast-compatible LED lamps and the AC mains-operable LED lamps, it seems that market needs a most cost-effective solution by using a universal LED lamp that can be used with the AC mains and is compatible with a ballast so that LED lamp users can save an initial cost by changeover to such an LED lamp followed by retrofitting the lamp fixture to be used with the AC mains when the ballast dies.

Furthermore, the AC mains-operable LED lamps can easily be used with emergency lighting, which is especially important in this consumerism era. The emergency lighting systems in retail sales and assembly areas with an occupancy load of 100 or more are required by codes in many cities. Occupational Safety and Health Administration (OSHA) requires that a building's exit paths be properly and automatically lighted at least ninety minutes of illumination at a minimum of 10.8 lux so that an employee with normal vision can see along the exit route after the building power becomes unavailable. This means that emergency egress lighting must operate reliably and effectively during low visibility evacuations. To ensure reliability and effectiveness of backup lighting, building owners should abide by the National Fire Protection Association's (NFPA) emergency egress light requirements that emphasize performance, operation, power source, and testing. OSHA requires most commercial buildings to adhere to the NFPA standards or a significant fine. Meeting OSHA requirements takes time and investment, but not meeting them could result in fines and even prosecution. If a building has egress lighting problems that constitute code violations, the quickest way to fix is to replace existing lamps with multi-function LED lamps that have an emergency light package integrated with the normal lighting. The code also requires the emergency lights be inspected and tested to ensure they are in proper working conditions at all times. It is, therefore, the manufacturers' responsibility to design an LED lamp, an LED luminaire, or an LED lighting system with an LED luminaire control gear such that after the LED lamp or the LED luminaire is installed on a ceiling or in a room, the LED luminaire control gear with an emergency battery system can be readily connected with the LED lamp or the LED luminaire on site to meet regulatory requirements, especially without further retrofits or modifications of the LED lamp or the LED luminaire.

SUMMARY

An LED lighting system comprising a luminaire and an LED luminaire control gear cascaded by the luminaire is used to replace a fluorescent or an LED lamp normally operated with the AC mains. The luminaire comprises one or more LED arrays with a forward voltage across thereon and a power supply unit that powers the one or more LED arrays. The LED luminaire control gear comprises a rechargeable battery, a line voltage detection and control circuit, and a current-fed inverter configured to receive power from the rechargeable battery and to generate at least one high output voltage, $V_H$, and at least one low direct-current (DC) output voltage, $V_L$, when the line voltage from the AC mains is unavailable. The at least one high output voltage, $V_H$, is compatible to a voltage in an input operating voltage range of the power supply unit whereas the at least one low DC output voltage is compatible to a voltage in a range of 0-to-10 volts. The line voltage detection and control circuit comprises a relay switch configured to couple either the line voltage from the AC mains or the at least one high output voltage, $V_H$, to the power supply unit to operate thereon. The line voltage detection and control circuit further comprises a transistor circuit configured to enable the current-fed inverter.

The power supply unit comprises at least two electrical conductors, a main full-wave rectifier, and an input filter. The at least two electrical conductors are configured to couple to the LED luminaire control gear, receiving either the line voltage from the AC mains or the at least one high output voltage, $V_H$. The main full-wave rectifier is coupled to the at least two electrical conductors to convert either the line voltage from the AC mains or the at least one high output voltage, $V_H$, into a fourth DC voltage. The input filter is configured to suppress electromagnetic interference (EMI) noises. The power supply unit further comprises a power switching converter comprising a main transformer and a power factor correction (PFC) and power switching circuit. The PFC and power switching circuit is coupled to the main full-wave rectifier via the input filter and configured to improve a power factor, to reduce voltage ripples, and to convert the fourth DC voltage into a fifth DC voltage. The fifth DC voltage is configured to couple to the one or more LED arrays to operate thereon. The power switching converter further comprises a pulse width modulation (PWM) control circuit and a pair of input ports configured to receive a 0-to-10 V signal, a 1-to-10 V signal, a PWM signal, or a signal from a variable resistor for luminaire dimming applications. The PFC and power switching circuit is generally a current source, in which when the one or more LED arrays require more current than a predetermined maximum, the fifth DC voltage drops accordingly to maintain power conservation. In other words, when the LED luminaire control gear is cascaded by the luminaire powered by the LED luminaire control gear that only provides a fraction of power compared with a rated power of the luminaire, there exists an operating uncertainty that a driving voltage and current provided by the LED luminaire control gear to drive the one or more LED arrays may fall into an unstable operating situation. That is, when the one or more LED arrays require more current than a predetermined maximum, the fifth DC voltage drops below the forward voltage of the one or more LED arrays, resulting in an operating failure of the one or more LED arrays. When the power supply unit recovers to start tracking current, the fifth DC voltage recovers to an original level, thereby temporarily operating the one or more LED arrays. Such a voltage and current competition continues, creating a phenomenon called luminaire strobing. Therefore, the LED luminaire control gear must provide an additional signal to control the power supply unit to operate stably and efficiently the one or more LED arrays at low power conditions.

The LED luminaire control gear further comprises a full-wave rectifier and a charging circuit. The full-wave rectifier is coupled to the AC mains and configured to convert the line voltage from the AC mains into a first DC voltage. The charging circuit comprises a first transformer, a feedback control circuit, a control device, a first electronic switch, a diode, a first ground reference, and a second ground reference electrically isolated from the first ground reference. The first electronic switch comprises a metaloxide-semiconductor field-effect transistor (MOSFET) or a transistor. The charging circuit is coupled to the full-wave rectifier and configured to convert the first DC voltage into a second DC voltage that charges the rechargeable battery to reach a third DC voltage. The feedback control circuit is configured to monitor the second DC voltage and to regulate the control device in response to various charging requirements. The current-fed inverter comprises a second transformer having a primary side and a secondary side. The secondary side comprises at least two windings. The current-fed inverter is configured to receive the third DC voltage from the rechargeable battery and to convert the third DC voltage into the at least one high output voltage, $V_H$, and the at least one low DC output voltage, $V_L$, when the line voltage from the AC mains is unavailable. The at least one low DC output voltage, $V_L$, is coupled to the PWM control circuit via the pair of input ports and configured to control the fifth DC voltage to be greater than the LED forward voltage for the one or more LED arrays to operate, avoiding instability of the fifth DC voltage due to the voltage and current competition in a constant current-limiting operation of the power switching converter. The secondary side further comprises a rectifier and at least one capacitor, the rectifier and the at least one capacitor configured to couple to one of the two windings and to generate the at least one low DC output voltage, $V_L$, when the line voltage from the AC mains is unavailable. The at least one low DC output voltage, $V_L$, is configured to control the power switching converter to operate with a fraction of power consumed when the line voltage from the AC mains is available, whereas a combination of the at least one low DC output voltage, $V_L$, and the at least one high output voltage, $V_H$, is configured to maintain stability of the power switching converter in a way that the one or more LED arrays are operated without strobing. The primary side comprises a second electronic switch, a third electronic switch, an upper portion of a center-tapped winding, a lower portion of the center-tapped winding, and a center-tapped port coupled between the upper portion of the center-tapped winding and the lower portion of the center-tapped winding. The center-tapped port is coupled to a high-potential electrode of the rechargeable battery. The upper portion of the center-tapped winding is driven in one direction of a current flow with the second electronic switch activated, whereas the lower portion of the center-tapped winding is driven in the opposite direction of the current flow with the third electronic switch activated. Each of the second electronic switch and the third electronic switch comprises a metal-oxide-semiconductor field-effect transistor (MOSFET) or a transistor.

The relay switch comprises a power sensing coil with a pick-up voltage and a drop-out voltage and is configured to couple either the at least one high output voltage, $V_H$, or the line voltage from the AC mains to the power supply unit to operate thereon, subsequently powering up the one or more LED arrays connected with the power supply unit. The relay switch further comprises a first pair of input electrical terminals, a second pair of input electrical terminals, and a third pair of input electrical terminals. The first pair of input electrical terminals are configured to couple to the line voltage from the AC mains, whereas the second pair of input electrical terminals are configured to couple to the at least one high output voltage, $V_H$. The third pair of input electrical terminals are configured to receive the pick-up voltage to operate the power sensing coil. The relay switch further comprises a pair of output electrical terminals configured to relay either the line voltage from the AC mains or the at least one high output voltage, $V_H$, to the power supply unit to operate thereon. In this case, the relay switch comprises a double-pole double-throw (DPDT) configuration, in which either the at least one high output voltage, $V_H$, and the line voltage from the AC mains can be coupled to the power supply unit with a return current to respectively operate thereon without crosstalk. The at least one high output voltage, $V_H$, is within an input operating voltage range of the power supply unit to guarantee that an under-voltage lockout will never occur.

The line voltage detection and control circuit further comprises a flyback module comprising a diode and a resistor connected in parallel with the diode, in which the diode is with a reverse polarity from the second DC voltage. The flyback module is connected in parallel with the power sensing coil. When the second DC voltage is greater than the third DC voltage, the pick-up voltage is built up for the power sensing coil to operate. The transistor circuit comprises a first transistor, a first resistor, and at least one diode and is configured to couple to the second DC voltage and the third DC voltage and to determine whether the line voltage from the AC mains is available or not. The first transistor is turned on or off to allow or forbid a discharge current from the third DC voltage to flow into the current-fed inverter to enable and disable thereon. The transistor circuit further comprises a second transistor, a second resistor, a voltage regulator, and a resistor-capacitor (RC) circuit. The second transistor, the second resistor, the voltage regulator, and the RC circuit are configured to couple to the first transistor to operate thereon. The transistor circuit further comprises a pair of electrical terminals coupled between the first resistor and the second resistor. The pair of electrical terminals are configured to couple the first transistor to the second transistor to operate the transistor circuit when the pair of electrical terminals are short-circuited. The pair of electrical terminals may be short-circuited by using a jumper, a jumper wire, or a switch. The transistor circuit further comprises a test switch coupled between the second DC voltage and the third DC voltage. When the test switch is pressed, the drop-out voltage is reached, thereby disabling the power sensing coil. In this case, the first transistor is turned on to enable the current-fed inverter. The line voltage detection and control circuit further comprises a first current guiding diode and a second current guiding diode. The first current guiding diode and the second current guiding diode are configured to conduct a charging current in one direction and a discharging current in another direction such that the second DC voltage is distinct from the third DC voltage.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified. Moreover, in the section of detailed description of the invention, any of a first, a second, a third, and so forth does not necessarily represent a part that is mentioned in an ordinal manner, but a particular one.

DETAILED DESCRIPTION OF THE INVENTION

Figure 1:
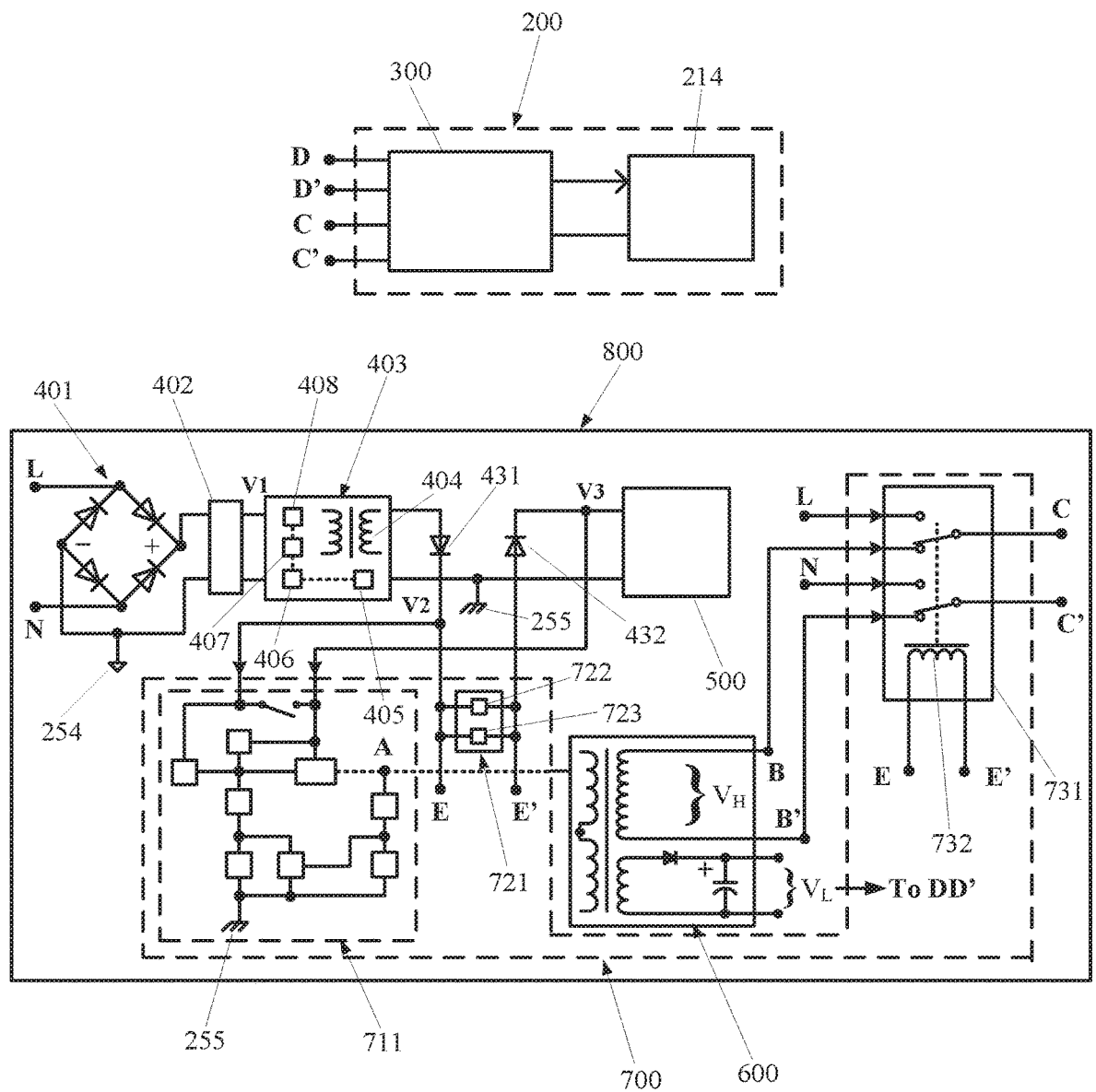
FIG. 1 is a block diagram of an LED luminaire control gear according to the present disclosure.

FIG. 1 is a block diagram of an LED luminaire control gear according to the present disclosure. The LED luminaire control gear 800 comprises a rechargeable battery 500, a full-wave rectifier 401, an input filter 402, a charging circuit 403, a current-fed inverter 600, and a line voltage detection and control circuit 700. In FIG. 1, the full-wave rectifier 401 is coupled to the AC mains and configured to convert the line voltage from the AC mains denoted as "L" and "N" into a first DC voltage, V1, after the input filter 402. The charging circuit 403 is an isolated step-down converter and comprises a first ground reference 254, a second ground reference 255 electrically isolated from the first ground reference 254, a transformer 404, a feedback control circuit 405, a control device 406, a first electronic switch 407, and a diode 408. The charging circuit 403 is coupled to the full-wave rectifier 401 via the input filter 402 and configured to convert the first DC voltage, V1, into a second DC voltage, V2, that charges the rechargeable battery 500 to reach a third DC voltage, V3. The feedback control circuit 405 is configured to monitor the second DC voltage, V2, and to regulate the control device 406 according to charging voltage and current requirements. The transformer 404 comprises a primary winding coupled to the first ground reference 254 and a secondary winding coupled to the second ground reference 255. The transformer 404 is configured to provide electrical isolation between the AC mains and the second DC voltage, V2, with respect to the second ground reference 255.

Figure 2:
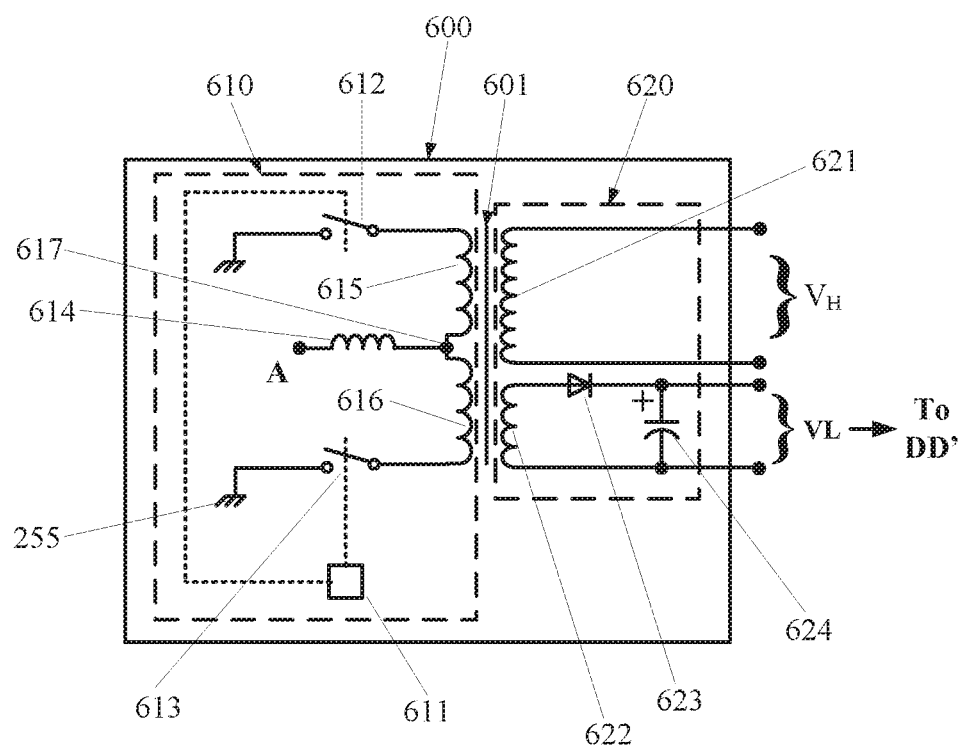
FIG. 2 is a block diagram of a current-fed inverter according to the present disclosure.

FIG. 2 is a block diagram of a current-fed inverter according to the present disclosure. Referring to FIG. 1 and FIG. 2, the current-fed inverter 600 comprises a second transformer 601 having a primary side 610 and a secondary side 620. The secondary side 620 comprises at least two windings 621 and 622. The current-fed inverter 600 is configured to receive the third DC voltage, V3, from the rechargeable battery 500 and to convert the third DC voltage, V3, into at least one high output voltage, $V_H$, and at least one low DC output voltage, $V_L$, when the line voltage from the AC mains is unavailable. The at least one high output voltage, $V_H$, is compatible to a voltage in an input operating voltage range of the power supply unit whereas the at least one low DC output voltage is compatible to a voltage in a range of 0-to-10 volts. The secondary side 620 further comprises a rectifier 623 and at least one capacitor 624. The rectifier 623 and the at least one capacitor 624 are configured to couple to one of the two windings 621 and 622 and to generate the at least one low DC output voltage, $V_L$, when the line voltage from the AC mains is unavailable. The at least one low DC output voltage, $V_L$, is coupled to an external power supply unit 300 via a pair of output ports denoted as "DD'" and configured to control the external power supply unit 300 in an external luminaire 200 to operate with a fraction of power consumed when the line voltage from the AC mains is available, whereas a combination of the at least one low DC output voltage, $V_L$, and the at least one high output voltage, $V_H$, is configured to maintain stability of the external power supply unit 300 in a way that external one or more LED arrays 214 connected to the external power supply unit 300 are operated without strobing. The primary side 610 comprises a control unit 611, a second electronic switch 612, a third electronic switch 613, an upper portion 615 of a center-tapped winding, a lower portion 616 of the center-tapped winding, and a center-tapped port 617 coupled between the upper portion 615 of the center-tapped winding and the lower portion 616 of the center-tapped winding. The center-tapped port 617 may be directly coupled to a high-potential electrode of the rechargeable battery 500 or via an inductor 614. The upper portion 615 of the center-tapped winding is driven in one direction of a current flow with the second electronic switch 612 activated, whereas the lower portion 616 of the center-tapped winding is driven in the opposite direction of the current flow with the third electronic switch 613 activated. Each of the first electronic switch 407, the second electronic switch 612, and the third electronic switch 613 comprises a metal-oxide-semiconductor field-effect transistor (MOSFET) or a transistor.

In FIG. 1, the line voltage detection and control circuit 700 comprising a relay switch 731 comprises a power sensing coil 732 with a pick-up voltage and a drop-out voltage and is configured to couple either the at least one high output voltage, $V_H$, or the line voltage from the AC mains to the external power supply unit 300 to operate thereon, subsequently powering up the one or more LED arrays 214 connected with the external power supply unit 300. The relay switch 731 further comprises a first pair, a second pair, and a third pair of input electrical terminals. The first pair of input electrical terminals denoted as "L" and "N" are configured to couple to the line voltage from the AC mains, whereas the second pair of input electrical terminals denoted as "BB'" are configured to couple to the at least one high output voltage, $V_H$. The third pair of input electrical terminals denoted as "EE'" are configured to receive the pick-up voltage to operate the power sensing coil 732. The relay switch 731 further comprises a pair of output electrical terminals denoted as "CC'" configured to relay either the line voltage from the AC mains or the at least one high output voltage, $V_H$, to the external power supply unit 300 to operate thereon. In this case, the relay switch 731 comprises a double-pole double-throw (DPDT) configuration, in which either the line voltage from the AC mains or the at least one high output voltage, $V_H$, can be simultaneously coupled to the external power supply unit 300 to respectively operate thereon without crosstalk. Although both the line voltage from the AC mains and the at least one high output voltage, $V_H$, can operate the external power supply unit 300, the at least one high output voltage, $V_H$, is less than the line voltage from the AC mains. Nevertheless, the at least one high output voltage, $V_H$, is within an input operating voltage range of the external power supply unit 300 to avoid the under-voltage lockout occurring. Besides, the current-fed inverter 600 provides a fraction of power the external power supply unit 300 consumes when the line voltage from the AC mains is available.

In FIG. 1, the line voltage detection and control circuit 700 further comprises a transistor circuit 711. The transistor circuit 711 is configured to enable and disable the current-fed inverter 600 via a port denoted as "A" according to availability of the AC mains. The transistor circuit 711 is further configured to disable the relay switch 731 when required. The line voltage detection and control circuit 700 further comprises a flyback module 721 comprising a diode 722 and a resistor 723 connected in parallel with the diode 722, in which the diode 722 is with a reverse polarity from the second DC voltage, V2. The flyback module 721 is connected in parallel with the power sensing coil 732. When the second DC voltage, V2, is greater than the third DC voltage, V3, the pick-up voltage is built up for the power sensing coil 732 to operate. In FIG. 1, the line voltage detection and control circuit 700 further comprises a first and a second current guiding diodes 431 and 432. The first current guiding diode 431 and the second current guiding diode 432 are configured to conduct a charging current in one direction and a discharging current in another direction such that the second DC voltage, V2, is distinct from the third DC voltage, V3. The charging circuit 403 may further comprise at least one capacitor (not shown) between the second DC voltage, V2, and the second ground reference 255.

Figure 3:
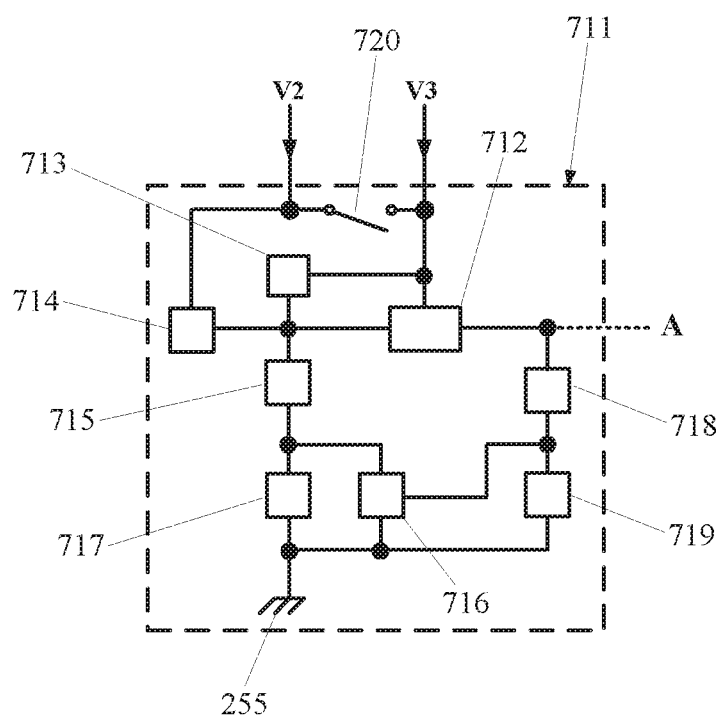
FIG. 3 is a block diagram of a transistor circuit according to the present disclosure.

FIG. 3 is a block diagram of the transistor circuit according to the present disclosure. The transistor circuit 711 comprises a first transistor 712, a first resistor 713, and at least one diode 714 and is configured to couple to the second DC voltage, V2, and the third DC voltage, V3, and to determine whether the line voltage from the AC mains is available or not. The first transistor 712 is turned on or off to allow or forbid the discharge current from the third DC voltage, V3, to flow into the current-fed inverter 600 to enable and disable thereon. The transistor circuit 711 further comprises a second transistor 716, a second resistor 717, a voltage regulator 718, and a resistor-capacitor (RC) circuit 719. The second transistor 716, the second resistor 717, the voltage regulator 718, and the RC circuit 719 are configured to couple to the first transistor 712 to operate thereon. The transistor circuit 711 further comprises a pair of electrical terminals 715 coupled between the first resistor 713 and the second resistor 717, in which the pair of electrical terminals 715 is configured to couple the first transistor 712 to the second transistor 716 to operate the transistor circuit 711 when the pair of electrical terminals 715 are short-circuited. The pair of electrical terminals 715 may be short-circuited by using a jumper, a jumper wire, or a switch. The transistor circuit 711 further comprises a test switch 720 coupled between the second DC voltage, V2, and the third DC voltage, V3. When the test switch 720 is pressed, the drop-out voltage is reached, thereby disabling the power sensing coil 732. In this case, the first transistor 712 is turned on to enable the current-fed inverter 600 via the port denoted as "A".

Figure 4:
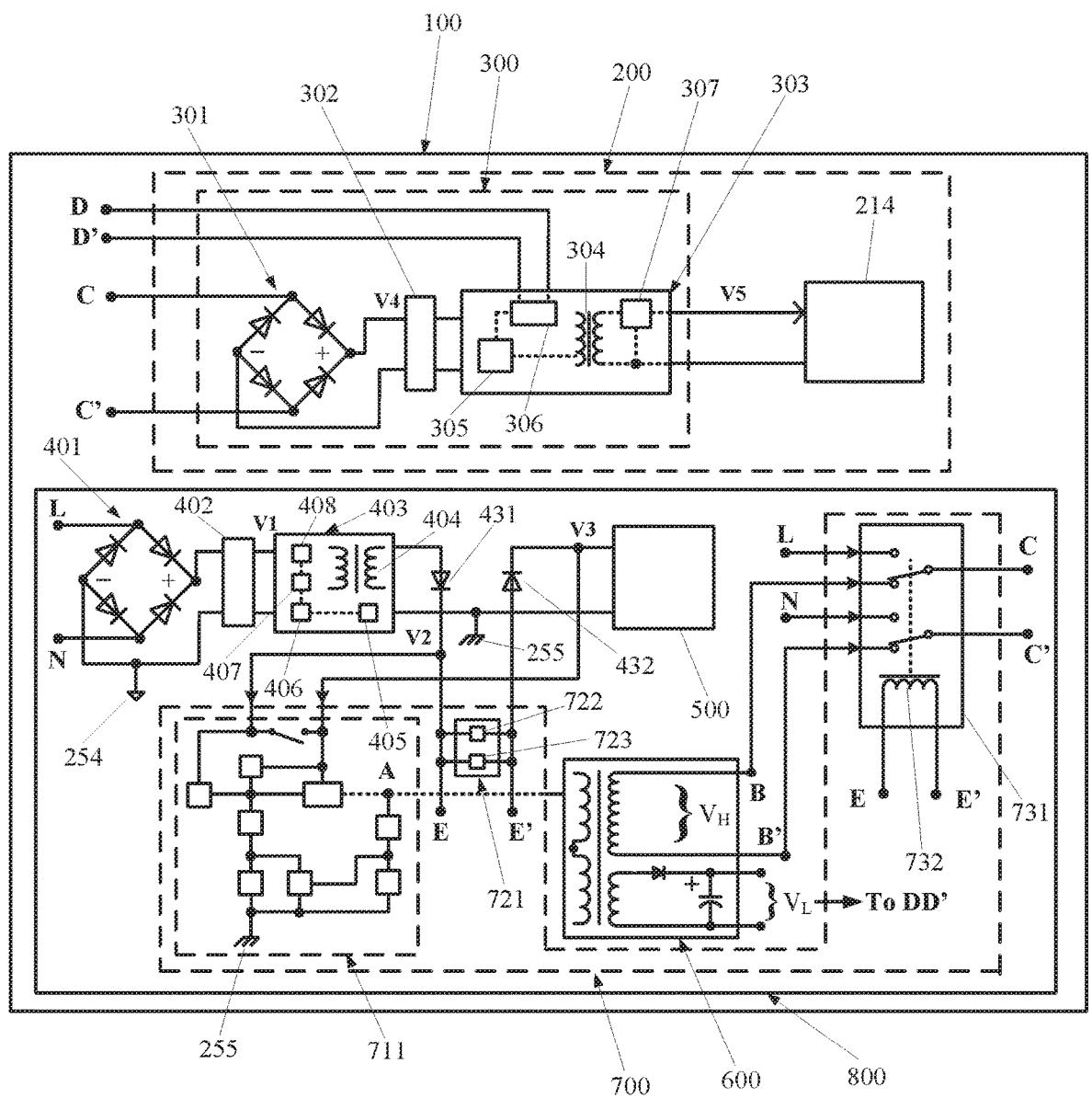
FIG. 4 is a block diagram of an LED lighting system with an LED luminaire control gear cascaded by a luminaire according to the present disclosure.

FIG. 4 is a block diagram of an LED lighting system with an LED luminaire control gear according to the present disclosure. In FIG. 4, the LED lighting system 100 comprises a luminaire 200 and an LED luminaire control gear 800. The LED luminaire control gear 800 is basically the same as depicted in FIG. 1. The luminaire 200 comprises one or more LED arrays 214 with a forward voltage across thereon and a power supply unit 300 originally designed to receive the line voltage from the AC mains at ports denoted as "CC'" for high-power lighting applications. When the line voltage from the AC mains is inputted, the power supply unit 300 generates a fifth DC voltage and a rated current to normally operate the one or more LED arrays 214. However, the LED luminaire control gear 800 is cascaded by the luminaire 200 powered by the LED luminaire control gear 800. When the line voltage from the AC mains is unavailable, the LED luminaire control gear 800 is automatically started to provide the at least one high output voltage, $V_H$, to the luminaire 200 with a fraction of rated power. Thereby, the power supply unit 300 is unable to provide a sufficient driving current to drive the one or more LED arrays 214. In this case, a phenomenon of strobing on the luminaire 200 may occur.

In FIG. 4, the LED luminaire control gear 800 comprises a rechargeable battery 500, a full-wave rectifier 401, an input filter 402, a charging circuit 403, a current-fed inverter 600, and a line voltage detection and control circuit 700. In FIG. 4, the full-wave rectifier 401 is coupled to the AC mains and configured to convert the line voltage from the AC mains denoted as "L" and "N" into a first DC voltage, V1, after the input filter 402. The charging circuit 403 is an isolated step-down converter and comprises a first ground reference 254, a second ground reference 255 electrically isolated from the first ground reference 254, a transformer 404, a feedback control circuit 405, a control device 406, a first electronic switch 407, and a diode 408. The charging circuit 403 is coupled to the full-wave rectifier 401 via the input filter 402 and configured to convert the first DC voltage, V1, into a second DC voltage, V2, that charges the rechargeable battery 500 to reach a third DC voltage, V3. The feedback control circuit 405 is configured to monitor the second DC voltage, V2, and to regulate the control device 406 according to charging voltage and current requirements. The transformer 404 comprises a primary winding coupled to the first ground reference 254 and a secondary winding coupled to the second ground reference 255. The transformer 404 is configured to provide electrical isolation between the AC mains and the second DC voltage, V2, with respect to the second ground reference 255.

In FIG. 4, the current-fed inverter 600 comprises a second transformer 601 having a primary side 610 and a secondary side 620. The secondary side 620 comprises at least two windings 621 and 622. The current-fed inverter 600 is configured to receive the third DC voltage, V3, from the rechargeable battery 500 and to convert the third DC voltage, V3, into at least one high output voltage, $V_H$, and at least one low DC output voltage, $V_L$, when the line voltage from the AC mains is unavailable. The at least one high output voltage, $V_H$, is compatible to a voltage in an input operating voltage range of the power supply unit 300 whereas the at least one low DC output voltage is compatible to a voltage in a range of 0-to-10 volts. The secondary side 620 further comprises a rectifier 623 and at least one capacitor 624. The rectifier 623 and the at least one capacitor 624 are configured to couple to one of the two windings 621 and 622 and to generate the at least one low DC output voltage, $V_L$, when the line voltage from the AC mains is unavailable. The at least one low DC output voltage, $V_L$, is configured to control the power supply unit 300 to operate with a fraction of power consumed when the line voltage from the AC mains is available, whereas a combination of the at least one low DC output voltage $V_L$, and the at least one high output voltage, $V_H$, is configured to maintain stability of the power supply unit 300 in a way that the one or more LED arrays 214 are operated without strobing. The primary side 610 comprises a control unit 611, a second electronic switch 612, a third electronic switch 613, an upper portion 615 of a center-tapped winding, a lower portion 616 of the center-tapped winding, and a center-tapped port 617 coupled between the upper portion 615 of the center-tapped winding and the lower portion 616 of the center-tapped winding. The center-tapped port 617 is coupled to a high-potential electrode of the rechargeable battery 500 via an inductor 614. The upper portion 615 of the center-tapped winding is driven in one direction of a current flow with the second electronic switch 612 activated, whereas the lower portion 616 of the center-tapped winding is driven in the opposite direction of the current flow with the third electronic switch 613 activated. Each of the first electronic switch 407, the second electronic switch 612, and the third electronic switch 613 comprises a metal-oxide-semiconductor field-effect transistor (MOSFET) or a transistor.

In FIG. 4, the line voltage detection and control circuit 700 comprises a relay switch 731. The relay switch 731 comprises a power sensing coil 732 with a pick-up voltage and a drop-out voltage and is configured to couple either the at least one high output voltage, $V_H$, or the line voltage from the AC mains to the power supply unit 300 to operate thereon, subsequently powering up one or more LED arrays 214 connected with the power supply unit 300. The line voltage detection and control circuit 700 further comprises a transistor circuit 711. The transistor circuit 711 is configured to enable and disable the current-fed inverter 600 via a port denoted as "A" according to availability of the AC mains. The transistor circuit 711 is further configured to disable the relay switch 731 when required. The relay switch 731 further comprises a first pair, a second pair, and a third pair of input electrical terminals. The first pair of input electrical terminals denoted as "L" and "N" are configured to couple to the line voltage from the AC mains, whereas the second pair of input electrical terminals denoted as "BB'" are configured to couple to the at least one high output voltage, $V_H$. The third pair of input electrical terminals denoted as "EE'" are configured to receive the pick-up voltage to operate the power sensing coil 732. The relay switch 731 further comprises a pair of output electrical terminals denoted as "CC'" configured to relay either the line voltage from the AC mains or the at least one high output voltage, $V_H$, to the power supply unit 300 to operate thereon. In this case, the relay switch 731 comprises a double-pole double-throw (DPDT) configuration, in which either the line voltage from the AC mains or the at least one high output voltage, $V_H$, can be simultaneously coupled to the power supply unit 300 to respectively operate thereon without crosstalk. Although both the line voltage from the AC mains and the at least one high output voltage, $V_H$, can operate the external power supply unit 300, the at least one high output voltage, $V_H$, may be less than the line voltage from the AC mains. Nevertheless, the at least one high output voltage, $V_H$, is within an input operating voltage range of the power supply unit 300 to avoid the under-voltage lockout occurring. Besides, the current-fed inverter 600 provides a fraction of power the power supply unit 300 consumes when the line voltage from the AC mains is available.

In FIG. 4, the line voltage detection and control circuit 700 further comprises a flyback module 721 comprising a diode 722 and a resistor 723 connected in parallel with the diode 722, in which the diode 722 is with a reverse polarity from the second DC voltage, V2. The flyback module 721 is connected in parallel with the power sensing coil 732. When the second DC voltage, V2, is greater than the third DC voltage, V3, the pick-up voltage is built up for the power sensing coil 732 to operate. In FIG. 4, the line voltage detection and control circuit 700 further comprises a first and a second current guiding diodes 431 and 432. The first current guiding diode 431 and the second current guiding diode 432 are configured to conduct a charging current in one direction and a discharging current in another direction such that the second DC voltage, V2, is distinct from the third DC voltage, V3. The charging circuit 403 may further comprise at least one capacitor (not shown) between the second DC voltage, V2, and the second ground reference 255.

In FIG. 4, the power supply unit 300 comprises at least two electrical conductors denoted as "C" and "C'", a main full-wave rectifier 301, and an input filter 302. The at least two electrical conductors denoted as "C" and "C'" are configured to couple to "CC'" ports in the LED luminaire control gear 800 and to convert either the line voltage from the AC mains or the at least one high output voltage $V_H$ into a fourth DC voltage, V4. The input filter 302 is configured to suppress electromagnetic interference (EMI) noises. The power supply unit 300 further comprises a power switching converter 303 comprising a main transformer 304 and a power factor correction (PFC) and power switching circuit 305. The PFC and power switching circuit 305 is coupled to the main full-wave rectifier 301 via the input filter 302 and configured to improve a power factor, to reduce voltage ripples, and to convert the fourth DC voltage into a fifth DC voltage. The fifth DC voltage is configured to couple to the one or more LED arrays 214 to operate thereon. The power switching converter 303 further comprises a pulse width modulation (PWM) control circuit 306 and a pair of input ports denoted as "DD'" configured to receive a 0-to-10 V signal, a 1-to-10 V signal, a PWM signal, or a signal from a variable resistor for luminaire dimming applications. The pair of input ports denoted as "DD'" are coupled to the current-fed inverter 600 to receive the at least one low DC output voltage, $V_L$. The PFC and power switching circuit 305 is basically a current source, in which when the one or more LED arrays require more current than a predetermined maximum, the fifth DC voltage drops accordingly to maintain power conservation. In FIG. 2, although configured to directly couple to the winding 621 without rectifiers and filters, the at least one high output voltage $V_H$ may be a DC voltage via the rectifiers and the filters coupled to the winding 621. If this is the case, the main full-wave rectifier 301 in FIG. 4 can still pass such a DC voltage to the power switching converter 303 to work.

Whereas preferred embodiments of the present disclosure have been shown and described, it will be realized that alterations, modifications, and improvements may be made thereto without departing from the scope of the following claims. Another kind of schemes with an LED luminaire control gear adopted in an LED lighting system to operate a luminaire using various kinds of combinations to accomplish the same or different objectives could be easily adapted for use from the present disclosure. Accordingly, the foregoing descriptions and attached drawings are by way of example only and are not intended to be limiting.

What is claimed is:

1. A light-emitting diode (LED) luminaire control gear, comprising:
   a rechargeable battery;
   a full-wave rectifier configured to be coupled to alternate-current (AC) mains to convert a line voltage from the AC mains into a first direct-current (DC) voltage;
   a charging circuit comprising a first transformer, a feedback control circuit, a control device, a first electronic switch, a diode, a first ground reference, and a second ground reference electrically isolated from the first ground reference, wherein the charging circuit is configured to be coupled to the full-wave rectifier to convert the first DC voltage into a second DC voltage that charges the rechargeable battery to reach a third DC voltage, and wherein the feedback control circuit is configured to monitor the second DC voltage and to regulate the control device in response to various charging voltage and current requirements;
   a current-fed inverter comprising a second transformer having a primary side and a secondary side, wherein the secondary side comprises at least two windings, wherein the current-fed inverter is configured to receive the third DC voltage from the rechargeable battery and to convert the third DC voltage into at least one high output voltage compatible to a voltage in an input operating voltage range of a power supply unit and at least one low DC output voltage compatible to a voltage in a range of 0-to-10 volts when the line voltage from the AC mains is unavailable; and a line voltage detection and control circuit comprising a relay switch, wherein the line voltage detection and control circuit is configured to enable or disable the current-fed inverter according to availability of the AC mains, and wherein the relay switch comprises a power sensing coil with a pick-up voltage and a drop-out voltage and is configured to couple either the at least one high output voltage or the line voltage from the AC mains to an external power supply unit to operate thereon, subsequently powering up external one or more LED arrays connected with the external power supply unit, wherein:

the relay switch further comprises a first pair of input electrical terminals, a second pair of input electrical terminals, and a third pair of input electrical terminals, wherein the first pair of input electrical terminals are configured to couple to the line voltage from the AC mains, wherein the second pair of input electrical terminals are configured to receive the at least one high output voltage, and wherein the third pair of input electrical terminals are configured to receive the pick-up voltage to operate the power sensing coil; and the relay switch further comprises a pair of output electrical terminals configured to relay either the line voltage from the AC mains or the at least one high output voltage to the external power supply unit to operate thereon.

2. The LED luminaire control gear of claim 1, wherein the secondary side further comprises a rectifier and at least one capacitor, the rectifier and the at least one capacitor configured to couple to one of the two windings and to generate the at least one low DC output voltage when the line voltage from the AC mains is unavailable.

3. The LED luminaire control gear of claim 1, wherein the at least one low DC output voltage is configured to control the external power supply unit to operate with a fraction of power consumed when the line voltage from the AC mains is available, and wherein a combination of the at least one low DC output voltage and the at least one high output voltage is configured to maintain stability of the external power supply unit in a way that the external one or more LED arrays are operated without strobing.

4. The LED luminaire control gear of claim 1, wherein the relay switch comprises a double-pole double-throw (DPDT) configuration, and wherein either the at least one high output voltage or the line voltage from the AC mains is configured to be coupled to the external power supply unit with a return current to respectively operate thereon without crosstalk.

5. The LED luminaire control gear of claim 1, wherein the line voltage detection and control circuit further comprises a transistor circuit configured to couple the third DC voltage to the current-fed inverter and enable thereon when the line voltage from the AC mains is unavailable.

6. The LED luminaire control gear of claim 5, wherein the transistor circuit is further configured to enable or disable the relay switch to couple either the line voltage from the AC mains or the at least one high output voltage to the external power supply unit to operate thereon when the line voltage from the AC mains is respectively available and unavailable.

7. The LED luminaire control gear of claim 5, wherein the transistor circuit comprises a first transistor, a first resistor, and at least one diode, the transistor circuit configured to receive the second DC voltage and the third DC voltage and to determine whether the line voltage from the AC mains exists or not, wherein the first transistor is turned on or off to allow or forbid a discharge current from the third DC voltage to flow into the current-fed inverter to enable or disable thereon.

8. The LED luminaire control gear of claim 7, wherein the transistor circuit further comprises a second transistor, a second resistor, a voltage regulator, and a resistor-capacitor (RC) circuit, and wherein the second transistor, the second resistor, the voltage regulator, and the RC circuit are configured to help build up bias voltages for the first transistor to operate.

9. The LED luminaire control gear of claim 8, wherein the transistor circuit further comprises a pair of electrical terminals coupled between the first resistor and the second resistor, and wherein the pair of electrical terminals is configured to couple the first transistor to the second transistor to operate the transistor circuit when the pair of electrical terminals are short-circuited.

10. The LED luminaire control gear of claim 9, wherein the pair of electrical terminals are short-circuited by using a jumper, a jumper wire, or a switch.

11. The LED luminaire control gear of claim 8, wherein the transistor circuit further comprises a test switch coupled between the second DC voltage and the third DC voltage, wherein, when the test switch is pressed, the drop-out voltage is reached, thereby disabling the power sensing coil, and wherein, when the test switch is pressed, the first transistor is turned on to enable the current-fed inverter.

12. The LED luminaire control gear of claim 1, wherein the line voltage detection and control circuit further comprises a flyback module comprising a diode and a resistor connected in parallel with the diode, wherein the diode is with a reverse polarity from the second DC voltage, wherein the flyback module is connected in parallel with the power sensing coil, and wherein, when the second DC voltage is greater than the third DC voltage, the pick-up voltage is built up for the power sensing coil to operate.

13. The LED luminaire control gear of claim 1, wherein the primary side comprises a second electronic switch, a third electronic switch, an upper portion of a center-tapped winding, a lower portion of the center-tapped winding, and a center-tapped port coupled between the upper portion of the center-tapped winding and the lower portion of the center-tapped winding, wherein the center-tapped port is coupled to a high-potential electrode of the rechargeable battery, wherein the upper portion of the center-tapped winding is driven in one direction of a current flow with the second electronic switch activated, and wherein the lower portion of the center-tapped winding is driven in the opposite direction of the current flow with the third electronic switch activated.

14. The LED luminaire control gear of claim 13, wherein each of the second electronic switch and the third electronic switch comprises a metal-oxide-semiconductor field-effect transistor (MOSFET) or a transistor.

15. The LED luminaire control gear of claim 1, wherein the first electronic switch comprises a metal-oxide-semiconductor field-effect transistor (MOSFET) or a transistor.

16. The LED luminaire control gear of claim 1, wherein the line voltage detection and control circuit further comprises a first current guiding diode and a second current guiding diode, the first current guiding diode and the second current guiding diode configured to conduct a charging current in one direction and a discharging current in another direction such that the second DC voltage is distinct from the third DC voltage.

17. A light-emitting diode (LED) lighting system, comprising:
a luminaire, comprising:
one or more LED arrays with an LED forward voltage; and
a power supply unit, comprising:
at least two electrical conductors;
an input filter configured to suppress electromagnetic interference (EMI) noises;
a main full-wave rectifier coupled to the at least two electrical conductors, the main full-wave rectifier configured to convert a voltage inputted from the at least two electrical conductors into a fourth direct-current (DC) voltage;
a power switching converter comprising a main transformer and a power factor correction (PFC) and power switching circuit, wherein the PFC and power switching circuit is coupled to the main full-wave rectifier via the input filter and configured to improve a power factor, to reduce voltage ripples, and to convert the fourth DC voltage into a fifth DC voltage, wherein the fifth DC voltage is configured to couple to the one or more LED arrays to operate thereon, and wherein the power switching converter further comprises a pulse width modulation (PWM) control circuit and a pair of input ports configured to receive a 0-to-10 V (volts) signal, a 1-to-10 V (volts) signal, a PWM signal, or a signal from a variable resistor for luminaire dimming applications; and
an LED luminaire control gear, comprising:
a rechargeable battery;
a full-wave rectifier configured to be coupled to alternating current (AC) mains to convert a line voltage from the AC mains into a first DC voltage;
a charging circuit comprising a first transformer, a feedback control circuit, a control device, a first electronic switch, a diode, a first ground reference, and a second ground reference electrically isolated from the first ground reference, wherein the charging circuit is coupled to the full-wave rectifier and configured to convert the first DC voltage into a second DC voltage that charges the rechargeable battery to reach a third DC voltage, and wherein the feedback control circuit is configured to monitor the second DC voltage and to regulate the control device in response to various charging voltage and current requirements;
a current-fed inverter comprising a second transformer having a primary side and a secondary side, wherein the secondary side comprises at least two windings, wherein the current-fed inverter is configured to receive the third DC voltage from the rechargeable battery and to convert the third DC voltage into at least one high output voltage compatible to a voltage in an input operating voltage range of the power supply unit and at least one low DC output voltage compatible to a voltage in a range of 0-to-10 volts when the line voltage from the AC mains is unavailable; and
a line voltage detection and control circuit comprising a relay switch, wherein the line voltage detection and control circuit is configured to enable or disable the current-fed inverter according to availability of the AC mains, and wherein the relay switch comprises a power sensing coil with a pick-up voltage and a drop-out voltage and is configured to couple either the at least one high output voltage or the line voltage from the AC mains to the power supply unit to operate thereon, subsequently powering up the one or more LED arrays connected with the power supply unit,
wherein:
the at least one low DC output voltage is coupled to the PWM control circuit via the pair of input ports and configured to control the fifth DC voltage to be greater than the LED forward voltage for the one or more LED arrays to operate, avoiding instability of the fifth DC voltage due to a constant current operation of the power switching converter;
the relay switch further comprises a first pair of input electrical terminals, a second pair of input electrical terminals, and a third pair of input electrical terminals, wherein the first pair of input electrical terminals are configured to couple to the line voltage from the AC mains, wherein the second pair of input electrical terminals are configured to couple to the at least one high output voltage, and wherein the third pair of input electrical terminals are configured to receive the pick-up voltage to operate the power sensing coil; and
the relay switch further comprises a pair of output electrical terminals configured to relay either the line voltage from the AC mains or the at least one high output voltage to the power supply unit to operate thereon.

18. The LED lighting system of claim 17, wherein the secondary side further comprises a rectifier and at least one capacitor, the rectifier and the at least one capacitor configured to couple to one of the two windings and to generate the at least one low DC output voltage when the line voltage from the AC mains is unavailable.

19. The LED lighting system of claim 17, wherein the at least one low DC output voltage is configured to control the power switching converter to operate with a fraction of power consumed when the line voltage from the AC mains is available, and wherein a combination of the at least one low DC output voltage and the at least one high output voltage is configured to maintain stability of the power switching converter in a way that the one or more LED arrays are operated without strobing.

20. The LED lighting system of claim 17, wherein the relay switch comprises a double-pole double-throw (DPDT) configuration, and wherein either the at least one high output voltage or the line voltage from the AC mains is configured to be coupled to the power supply unit with a return current to respectively operate thereon without crosstalk.

21. The LED lighting system of claim 17, wherein the line voltage detection and control circuit further comprises a flyback module comprising a diode and a resistor connected in parallel with the diode, wherein the diode is with a reverse polarity from the second DC voltage, wherein the flyback module is connected in parallel with the power sensing coil, and wherein, when the second DC voltage is greater than the third DC voltage, the pick-up voltage is built up for the power sensing coil to operate.

22. The LED lighting system of claim 17, wherein the line voltage detection and control circuit further comprises a transistor circuit configured to couple the third DC voltage to the current-fed inverter and enable thereon when the line voltage from the AC mains is unavailable.

23. The LED lighting system of claim 22, wherein the transistor circuit comprises a first transistor, a first resistor, and at least one diode, the transistor circuit configured to receive the second DC voltage and the third DC voltage and to determine whether the line voltage from the AC mains exists or not, wherein the first transistor is turned on or off to allow or forbid a discharge current from the third DC voltage to flow into the current-fed inverter to enable or disable thereon.

24. The LED lighting system of claim 23, wherein the transistor circuit further comprises a test switch coupled between the second DC voltage and the third DC voltage, wherein, when the test switch is pressed, the drop-out voltage is reached, thereby disabling the power sense coil, and wherein, when the test switch is pressed, the first transistor is turned on to enable the current-fed inverter.

25. The LED lighting system of claim 22, wherein the transistor circuit further comprises a second transistor, a second resistor, a voltage regulator, and a resistor-capacitor (RC) circuit, and wherein the second transistor, the second resistor, the voltage regulator, and the RC circuit are configured to help build up bias voltages for the first transistor to operate.

26. The LED lighting system of claim 25, wherein the transistor circuit further comprises a pair of electrical terminals coupled between the first resistor and the second resistor, and wherein the pair of electrical terminals is configured to couple the first transistor to the second transistor to operate the transistor circuit when the pair of electrical terminals are short-circuited.

27. The LED lighting system of claim 26 wherein the pair of electrical terminals are short-circuited by using a jumper, a jumper wire, or a switch.

28. The LED luminaire control gear of claim 17, wherein the primary side comprises a second electronic switch, a third electronic switch, an upper portion of a center-tapped winding, a lower portion of the center-tapped winding, and a center-tapped port coupled between the upper portion of the center-tapped winding and the lower portion of the center-tapped winding, wherein the center-tapped port is coupled to a high-potential electrode of the rechargeable battery, wherein the upper portion of the center-tapped winding is driven in one direction of a current flow with the second electronic switch activated, and wherein the lower portion of the center-tapped winding is driven in the opposite direction of the current flow with the third electronic switch activated.

29. The LED luminaire control gear of claim 28, wherein each of the second electronic switch and the third electronic switch comprises a metal-oxide-semiconductor field-effect transistor (MOSFET) or a transistor.

30. The LED luminaire control gear of claim 17, wherein the first electronic switch comprises a metal-oxide-semiconductor field-effect transistor (MOSFET) or a transistor.

31. The LED luminaire control gear of claim 17, wherein the line voltage detection and control circuit further comprises a first current guiding diode and a second current guiding diode, the first current guiding diode and the second current guiding diode configured to conduct a charging current in one direction and a discharging current in another direction such that the second DC voltage is distinct from the third DC voltage.

* * * * *